(12) United States Patent
Sun et al.

(10) Patent No.: US 9,012,847 B2
(45) Date of Patent: Apr. 21, 2015

(54) SWITCHABLE READOUT DEVICE

(71) Applicant: National Chi Nan University, Puli, Nantou (TW)

(72) Inventors: Tai-Ping Sun, Jhongli (TW); Yi-Chuan Lu, Lieyu Township, Kinmen County (TW); Ming-Sheng Yang, Nantou (TW); Tse-Hsin Chen, Nantou (TW)

(73) Assignee: National Chi Nan University, Puli, Nantou (TW)

( * ) Notice: Subject to any disclaimer, the term of this patent is extended or adjusted under 35 U.S.C. 154(b) by 0 days.

(21) Appl. No.: 14/503,586

(22) Filed: Oct. 1, 2014

(65) Prior Publication Data

US 2015/0014534 A1    Jan. 15, 2015

Related U.S. Application Data

(62) Division of application No. 13/904,538, filed on May 29, 2013, now Pat. No. 8,878,595.

(30) Foreign Application Priority Data

Jan. 14, 2013    (TW) .............................. 102101375 A

(51) Int. Cl.
*G01J 3/36*    (2006.01)
*G01J 5/02*    (2006.01)
*G01J 5/10*    (2006.01)

(52) U.S. Cl.
CPC ....... *G01J 5/02* (2013.01); *G01J 5/10* (2013.01)

(58) Field of Classification Search
CPC ................. G01J 3/36; H01L 27/14652; H01L 27/14649; H03K 17/00
USPC ....................................................... 250/338.1
See application file for complete search history.

(56) References Cited

U.S. PATENT DOCUMENTS

| | | | |
|---|---|---|---|
| 4,728,828 A | 3/1988 | Goodnough | |
| 5,523,570 A * | 6/1996 | Hairston | ....................... 250/349 |
| 5,953,060 A | 9/1999 | Dierickx | |
| 6,434,187 B1 | 8/2002 | Beard et al. | |
| 6,885,002 B1 * | 4/2005 | Finch et al. | ................... 250/332 |
| 7,148,727 B2 | 12/2006 | Van Bogget | |
| 2007/0125070 A1 | 6/2007 | Storhok et al. | |
| 2013/0277561 A1 | 10/2013 | Woolaway et al. | |
| 2014/0061472 A1 | 3/2014 | Salvestrini et al. | |

* cited by examiner

*Primary Examiner* — Marcus Taningco
(74) *Attorney, Agent, or Firm* — Merchant & Gould P.C.

(57) ABSTRACT

A readout device is adapted for dual-band sensing, and includes an amplifier, two direct injection (DI) readout circuits to be respectively connected to two sensors, and a switching module. Through operation of the switching module, one of the DI readout circuits can be electrically connected to the amplifier, and cooperate with the other DI readout circuit to achieve a dual-band sensing feature.

6 Claims, 9 Drawing Sheets

SWITCHABLE READOUT DEVICE

CROSS-REFERENCE TO RELATED APPLICATION

This application is a Divisional Application of U.S. application Ser. No. 13/904,538, filed 29 May 2013, which claims priority to Taiwanese Application No. 102101375, filed on Jan. 14, 2013 and which applications are incorporated herein by reference. To the extent appropriate, a claim of priority is made to each of the above disclosed applications.

BACKGROUND OF THE INVENTION

1. Field of the Invention

The invention relates to a readout device, and more particularly to a switchable readout device.

2. Description of the Related Art

Infrared radiation is commonly distributed on object surfaces. The infrared signal is classified into short-wave infrared (SWIR) whose wavelength ranges from 1~3 µm, mid-wave infrared (MWIR) whose wavelength ranges from 3~5 µm, and long-wave infrared (LWIR) whose wavelength ranges from 6~15 µm.

Although the single-band sensing technique is a somewhat mature technology, it is not able to adjust the sensing band in response to variation of ambient temperature and geographic background, and may thus result in low sensing precision or sensing failure.

In the conventional dual-band sensing techniques, sensors for different bands have to cooperate with different readout circuits, resulting in a complicated design and higher costs.

SUMMARY OF THE INVENTION

Therefore, an object of the present invention is to provide a switchable readout device that may favor reduction of manufacturing costs.

According to one aspect of the present invention, a readout device is adapted for use with a first sensor and a second sensor, the first sensor generating a first sensed current upon a sensing activity thereof, the second sensor generating a second sensed current upon a sensing activity thereof. The readout device comprises:

an amplifier including a first input disposed to receive a reference voltage, a second input and an output;

a first direct injection (DI) readout circuit including a current input to be coupled to the first sensor so as to receive the first sensed current therefrom, and a biasing terminal, and configured to convert the first sensed current for obtaining a first output voltage;

a second DI readout circuit including a current input to be coupled to the second sensor so as to receive the second sensed current therefrom, and a biasing terminal, and configured to convert the second sensed current for obtaining a second output voltage; and a switching module coupled to the second input of the amplifier and the current inputs of the first and second DI readout circuits, the switching module being controllable to make or break electrical connection between the current input of the first DI readout circuit and the second input of the amplifier, and to make or break electrical connection between the current input of the second DI readout circuit and the second input of the amplifier;

the switching module being further coupled to the output of the amplifier and the biasing terminals of the first and second DI readout circuits, and to be coupled to a bias voltage source, the switching module being controllable to make or break electrical connection between the biasing terminal of the first DI readout circuit and one of the output of the amplifier and the bias voltage source, and to make or break electrical connection between the biasing terminal of the second DI readout circuit and one of the output of the amplifier and the bias voltage source.

According to another aspect of the present invention, a readout device comprises:

an amplifier including a first input disposed to receive a reference voltage, a second input and an output;

a first direct injection (DI) readout circuit including a current input to be coupled to the first sensor so as to receive the first sensed current therefrom, a biasing terminal, a first terminal and a second terminal, and configured to convert the first sensed current for producing a first output voltage;

a second DI readout circuit including a current input to be coupled to the second sensor so as to receive the second sensed current therefrom, a biasing terminal, a first terminal and a second terminal, and configured to convert the second sensed current for producing a second output voltage; and a switching module coupled to the second input of the amplifier and the first terminals of the first and second DI readout circuits, the switching module being controllable to make or break electrical connection between the first terminal of the first DI readout circuit and the second input of the amplifier, and to make or break electrical connection between the first terminal of the second DI readout circuit and the second input of the amplifier;

the switching module being further coupled to the output of the amplifier and the second terminals of the first and second DI readout circuits, the switching module being controllable to make or break electrical connection between the second terminal of the first DI readout circuit and the output of the amplifier, and to make or break electrical connection between the second terminal of the second DI readout circuit and the output of the amplifier;

the switching module being further coupled to the biasing terminals of the first and second DI readout circuits, and to be coupled to a ground node and a bias voltage source, the switching module being controllable to make or break electrical connection between the biasing terminal of the first DI readout circuit and one of the ground node and the bias voltage source, and to make or break electrical connection between the biasing terminal of the second DI readout circuit and one of the ground node and the bias voltage source.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
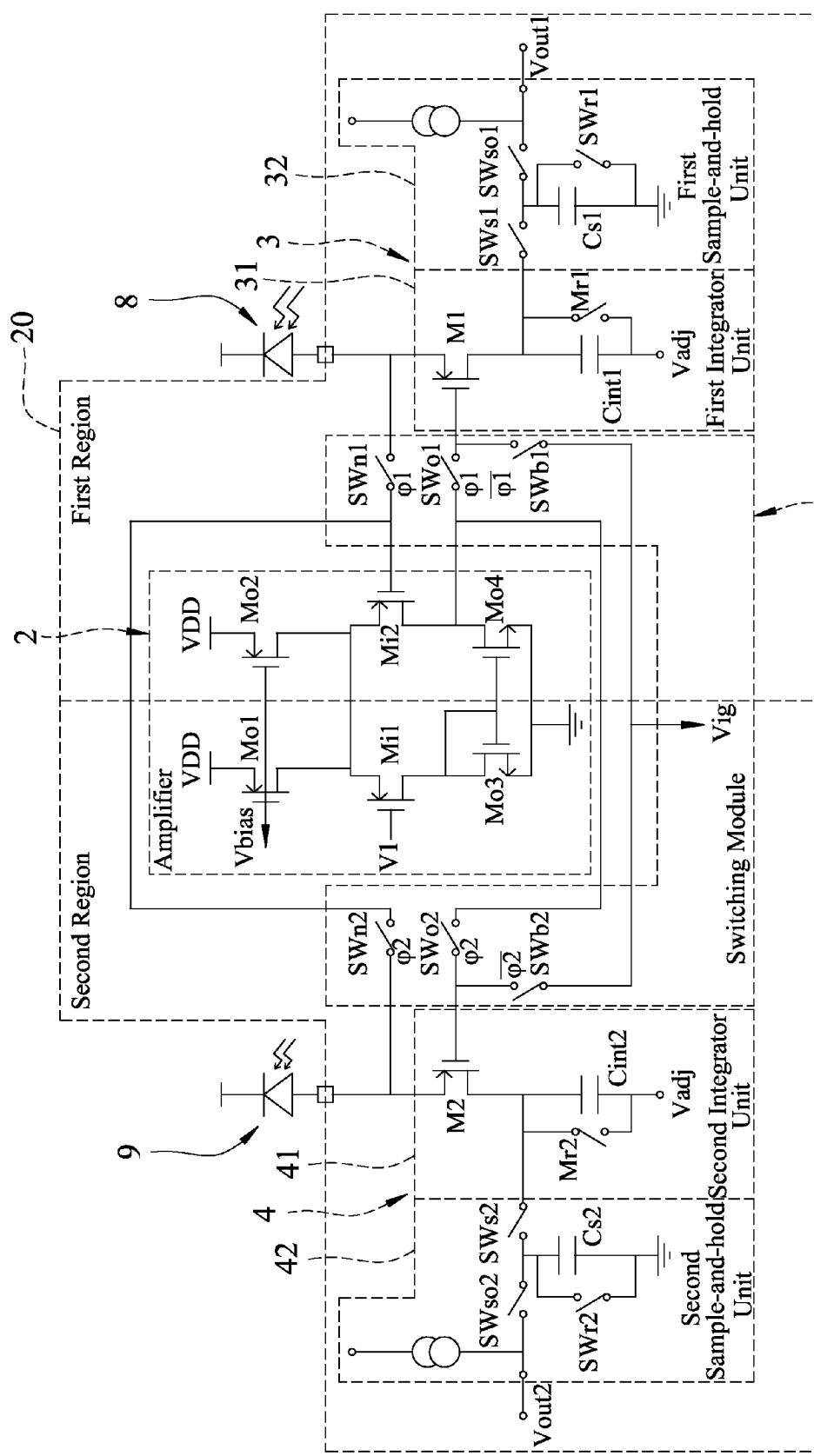
FIG. 1 is a schematic circuit diagram illustrating a first preferred embodiment of the switchable readout device according to the present invention.

Referring to FIG. 1, the first preferred embodiment of the switchable readout device 20 according to this invention is adapted for use with a first sensor 8 and a second sensor 9.

The first sensor 8 generates a first sensed current upon a sensing activity thereof on a first band of a sensing target.

The second sensor 9 generates a second sensed current upon a sensing activity thereof on a second band of the sensing target.

In this embodiment, the sensing target is infrared, and the first and second bands may respectively be mid-wave infrared (MWIR) and long-wave infrared (LWIR), or respectively be LWIR and MWIR.

The switchable readout device 20 includes an amplifier 2, a first direct injection (DI) readout circuit 3, a second DI readout circuit 4, and a switching module 5 coupled to the amplifier 2.

Through operation of the switching module 5, when the first DI readout circuit 3 (or the second DI readout circuit 4) is not coupled to the amplifier 2, it is a DI readout circuit. However, when the first DI readout circuit 3 (or the second DI readout circuit 4) is coupled to the amplifier 2 through the switching module 5, the coupled first DI readout circuit 3 (or second DI readout circuit 4) and amplifier 2 form a buffer direct injection (BDI) readout circuit, so as to sense a different band from the DI readout circuit.

The amplifier 2 includes a non-inverting input (first input) to receive a reference voltage V1, an inverting input (second input) and an output. In this embodiment, the amplifier 2 is implemented using, but is not limited to, a differential pair buffer amplifier.

The first DI readout circuit 3 includes a current input coupled to the first sensor 8 so as to receive the first sensed current therefrom, a biasing terminal, a first integrator unit 31 and a first sample-and-hold unit 32. The first DI readout circuit 3 is controllable to convert the first sensed current for obtaining a first output voltage Vout1.

The first integrator unit 31 is coupled to the current input and the biasing terminal of the first DI readout circuit 3, and is configured to convert the first sensed current into a first integration voltage that has a magnitude proportional to a magnitude of the first sensed current. The first integrator unit 31 includes a first transistor M1, a first integrator capacitor Cint1 and a first reset switch Mr1.

The first transistor M1 has a first terminal coupled to the current input of the first DI readout circuit 3, a second terminal, and a control terminal coupled to the biasing terminal of the first DI readout circuit 3. The first integrator capacitor Cint1 has a first terminal coupled to the second terminal of the first transistor M1, and a second terminal to receive an adjustment voltage Vadj. The first reset switch Mr1 is coupled across the first integrator capacitor Cint1 for resetting a voltage across the first integrator capacitor Cint1.

The first sample-and-hold unit 32 is coupled to the first integrator unit 31 to receive the first integration voltage, and is controllable to sample the first integration voltage and hold the first integration voltage thus sampled to obtain the first output voltage Vout1. The first sample-and-hold unit 32 includes a first sampling switch SWs1, a first sampling capacitor Cs1, a first sampling reset switch SWr1 and a first sampling output switch SWso1.

The first sampling switch SWs1 has a first terminal coupled to the first terminal of the first integrator capacitor Cint1, and a second terminal. The first sampling capacitor Cs1 has a first terminal coupled to the second terminal of the first sampling switch SWs1, and a grounded second terminal. The first sampling reset switch SWr1 is coupled to the first sampling capacitor Cs1 in parallel for resetting a voltage across the first sampling capacitor Cs1. The first sampling output switch SWso1 has a first terminal coupled to the first terminal of the first sampling capacitor Cs1, and a second terminal to output the first output voltage Vout1.

The second DI readout circuit 4 includes a current input coupled to the second sensor 9 so as to receive the second sensed current therefrom, a biasing terminal, a second integrator unit 41 and a second sample-and-hold unit 42. The second DI readout circuit 4 is controllable to convert the second sensed current for obtaining a second output voltage Vout2.

The second integrator unit 41 is coupled to the current input and the biasing terminal of the second DI readout circuit 4, and is configured to convert the second sensed current into a second integration voltage that has a magnitude proportional to a magnitude of the second sensed current. The second integrator unit 41 includes a second transistor M2, a second integrator capacitor Cint2 and a second reset switch Mr2.

The second transistor M2 has a first terminal coupled to the current input of the second DI readout circuit 4, a second terminal, and a control terminal coupled to the biasing terminal of the second DI readout circuit 4. The second integrator capacitor Cint2 has a first terminal coupled to the second terminal of the second transistor M2, and a second terminal to receive the adjustment voltage Vadj. The second reset switch Mr2 is coupled across the second integrator capacitor Cint2 for resetting a voltage across the second integrator capacitor Cint2.

The second sample-and-hold unit 42 is coupled to the second integrator unit 41 to receive the second integration voltage, and is controllable to sample the second integration voltage and hold the second integration voltage thus sampled to obtain the second output voltage Vout2. The second sample-and-hold unit 42 includes a second sampling switch SWs2, a second sampling capacitor Cs2, a second sampling reset switch SWr2 and a second sampling output switch SWso2. The second sampling switch SWs2 has a first terminal coupled to the first terminal of the second integrator capacitor Cint2, and a second terminal. The second sampling capacitor Cs2 has a first terminal coupled to the second terminal of the second sampling switch SWs2, and a grounded second terminal. The second sampling reset switch SWr2 is coupled to the second sampling capacitor Cs2 in parallel for resetting a voltage across the second sampling capacitor Cs2. The second sampling output switch SWso2 has a first terminal coupled to the first terminal of the second sampling capacitor Cs2, and a second terminal to output the second output voltage Vout2.

In this embodiment, the first and second transistors M1, M2 are implemented using, but not limited to, P-type metal-oxide-semiconductor field-effect transistors (MOSFETs), and the first and second reset switches Mr1, Mr1 are implemented using, but not limited to, N-type MOSFETs.

The switching module 5 is coupled to the second input of the amplifier 2 and the current inputs of the first and second DI readout circuits 3, 4. The switching module 5 is controllable to make or break electrical connection between the current input of the first DI readout circuit 3 and the second input of the amplifier 2, and to make or break electrical connection between the current input of the second DI readout circuit 4 and the second input of the amplifier 2.

The switching module 5 is further coupled to the output of the amplifier 2 and the biasing terminals of the first and second DI readout circuits 3, 4, and is coupled to a bias voltage source Vig. The switching module 5 is controllable to make or break electrical connection between the biasing terminal of the first DI readout circuit 3 and one of the output of the amplifier 2 and the bias voltage source Vig, and to make or break electrical connection between the biasing terminal of the second DI readout circuit 4 and one of the output of the amplifier 2 and the bias voltage source Vig.

The switching module 5 includes a first input switch SWn1, a first output switch SWo1, a first biasing switch SWb1, a second input switch SWn2, a second output switch SWo2, and a second biasing switch SWb2.

The first input switch SWn1 is coupled between the second input of the amplifier 2 and the first terminal of the first transistor M1, and is controlled by a first signal $\phi 1$ to make or break electrical connection.

The first output switch SWo1 is coupled between the output of the amplifier 2 and the control terminal of the first transistor M1, and is controlled by the first signal $\phi 1$ to make or break electrical connection.

The first biasing switch SWb1 couples the control terminal of the first transistor M1 to the bias voltage source Vig, and is controlled by the first signal $\phi 1$ to make or break electrical connection.

The second input switch SWn2 is coupled between the second input of the amplifier 2 and the first terminal of the second transistor M2, and is controlled by a second signal $\phi 2$ to make or break electrical connection.

The second output switch SWo2 is coupled between the output of the amplifier 2 and the control terminal of the second transistor M2, and is controlled by the second signal $\phi 2$ to make or break electrical connection.

The second biasing switch SWb2 couples the control terminal of the second transistor M2 to the bias voltage source Vig, and is controlled by the second signal $\phi 2$ to make or break electrical connection.

Figure 2:
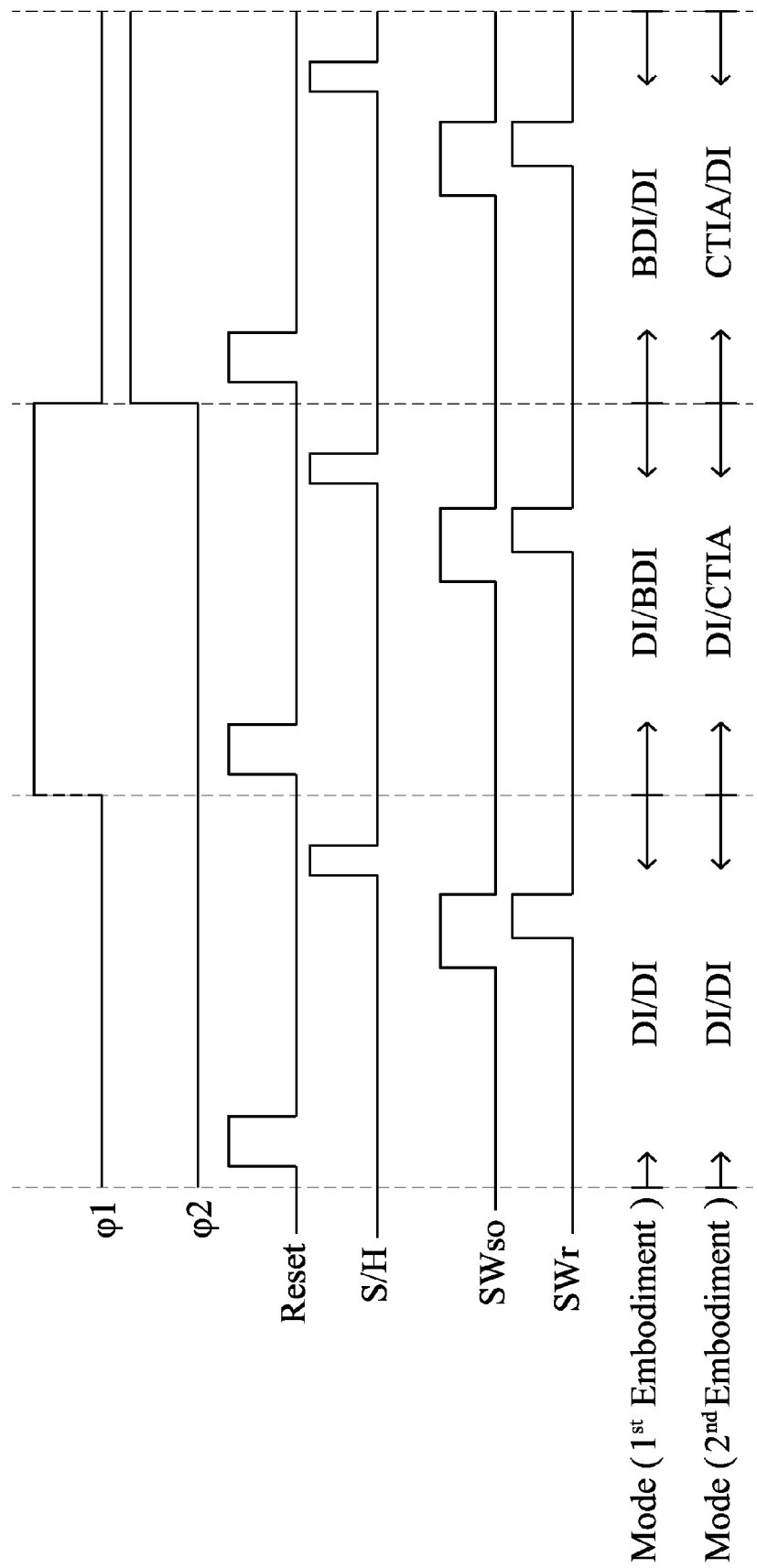
FIG. 2 is a timing diagram of the preferred embodiments.

Referring to FIGS. 1 and 2, in general use, the voltages across the first and second integrator capacitors Cint1, Cint2 are respectively reset through the first and second reset switches Mr1, Mr2 (see Reset signal in FIG. 2). The first and second sensors 8, 9 then sense infrared signals to generate and inject photocurrent into the first and second integrator capacitors Cint1, Cint2 through the first and second transistors M1, M2. After integration, the voltages stored in the first and second integrator capacitors Cint1, Cint2 are sampled through the first sampling switch SWs1, the second sampling switch SWs2, the first sampling capacitor Cs1 and the second sampling capacitor Cs2 (see S/H signal in FIG. 2), and the first and second output voltages Vout1, Vout2 are outputted through the first and second sampling output switches SWso1, SWso2 (see SWso signal in FIG. 2). The first and second sampling reset switches SWr1, SWr2 reset the voltages across the first and second sampling capacitors Cs1, Cs2 prior to sampling operation (see SWr signal in FIG. 2) for next integration and sampling operation.

Figure 3:
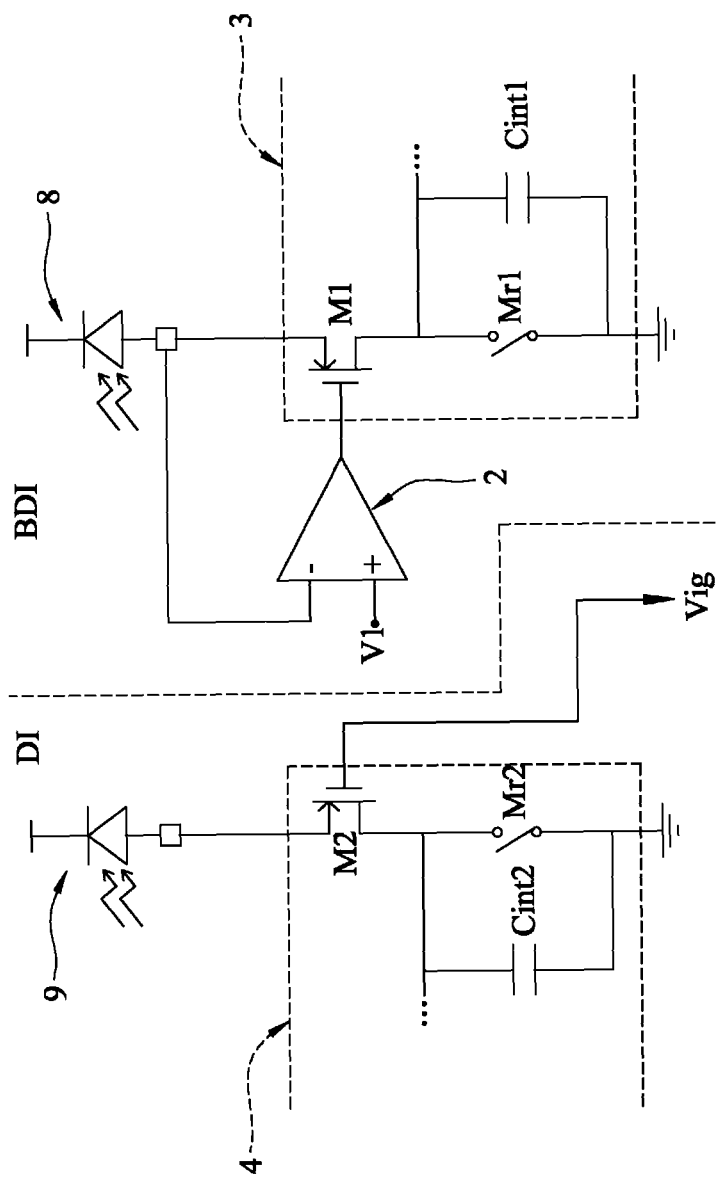
FIG. 3 is a schematic circuit diagram illustrating the first preferred embodiment operating in DI/BDI mode.
Figure 4:
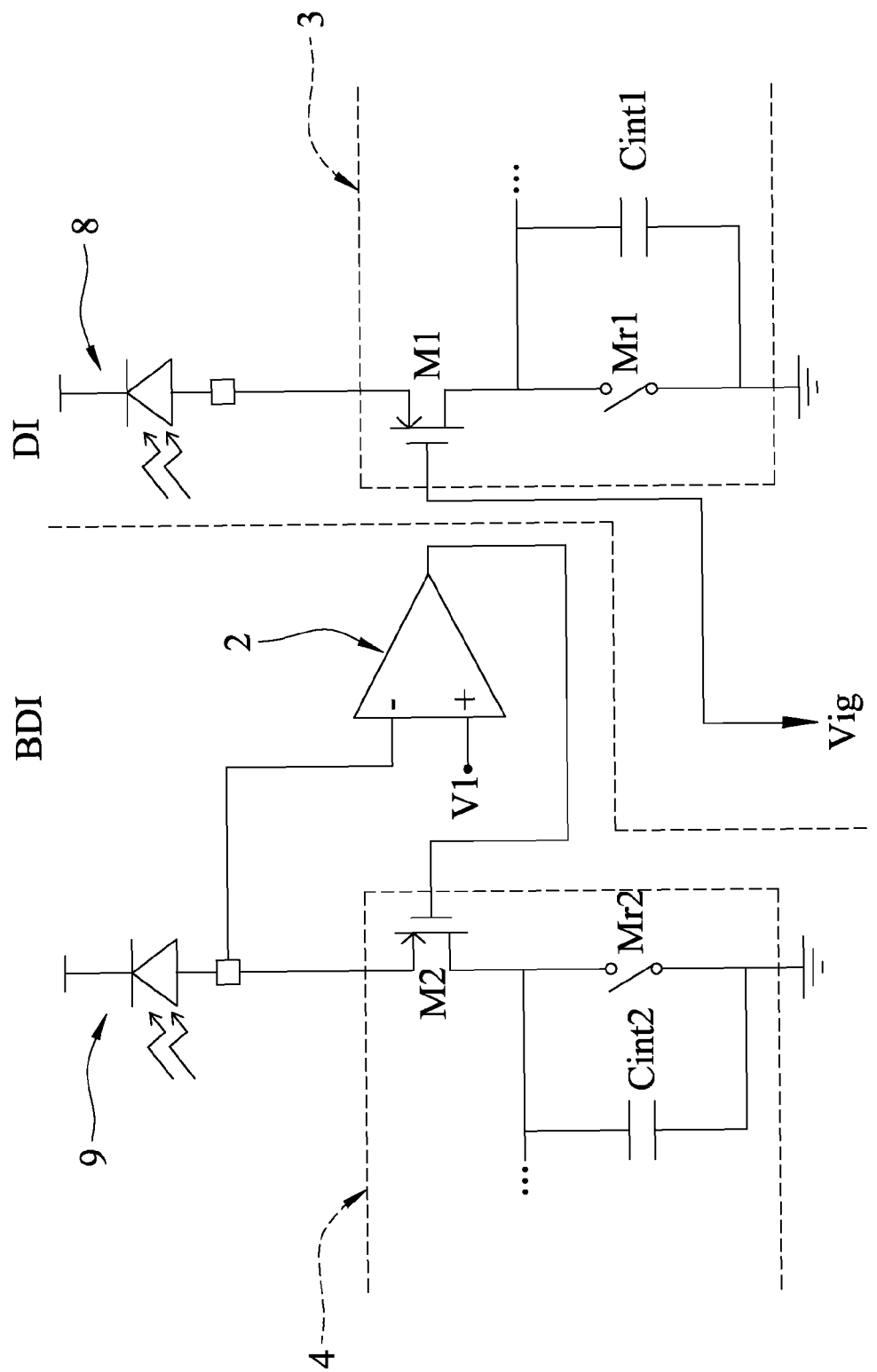
FIG. 4 is a schematic circuit diagram illustrating the first preferred embodiment operating in BDI/DI mode.
Figure 5:
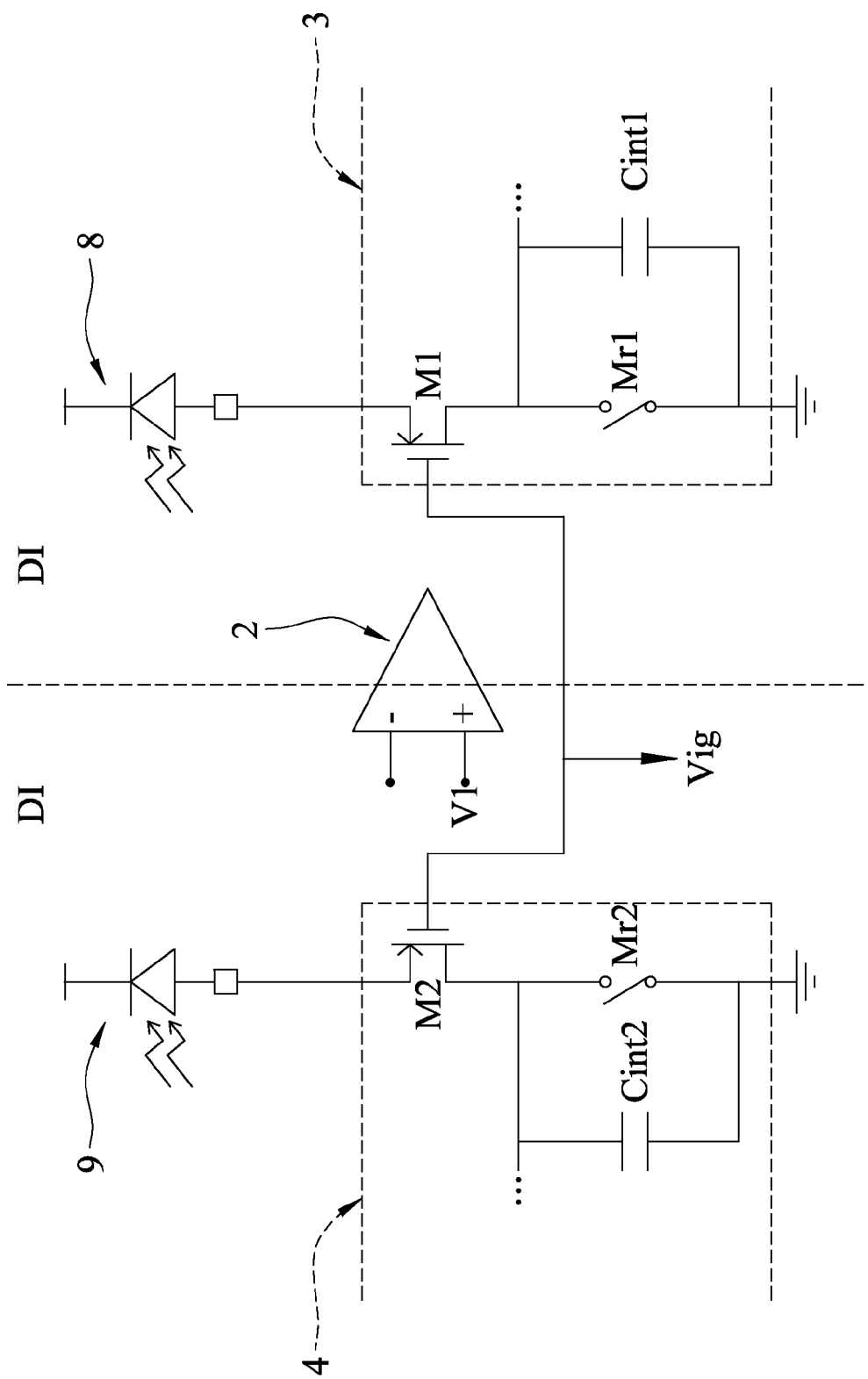
FIG. 5 is a schematic circuit diagram illustrating the first preferred embodiment operating in DI/DI mode.

As shown in FIGS. 3, 4 and 5, for the sake of illustration, only part of the circuit is drawn therein, and the adjustment voltage is denoted as a ground node.

DI/BDI Mode (for MWIR/LWIR)

Referring to FIGS. 2 and 3, when the first signal $\phi 1$ is logic 1, and the second signal $\phi 2$ is logic 0, the first DI readout circuit 3 is coupled to the amplifier 2, and the second DI readout circuit 4 is not coupled to the amplifier 2. The first DI readout circuit 3 and the amplifier 2 thus form a BDI readout circuit, while the second DI readout circuit 4 is still a DI readout circuit.

Since the BDI readout circuit includes the amplifier 2, it has relatively stable sensing bias, high injection effect, ideal linearity and low noise interference, and is thus commonly used for reading the LWIR signals. On the other hand, the DI readout circuit is used for reading the MWIR signals.

As shown in FIG. 3, in the BDI readout circuit, the output of the amplifier 2 is coupled to the control terminal of the first transistor M1, and the second input (inverting input) of the amplifier 2 is coupled to the source terminal (first terminal) of the first transistor M1, so that the input impedance changes from $1/gm$ to $1/(1+A)gm$, and injection efficiency is thus promoted. The biasing voltage of the first sensor 8 is fixed at a voltage magnitude as that of the reference voltage V1 received by the first input (non-inverting input) of the amplifier 2 due to the virtual short circuit characteristic of the amplifier 2.

The first sensor 8 senses the IR signal to generate and inject a photocurrent (first sensed current) into the first transistor M1. The charges of the photocurrent are accumulated in the first integrator capacitor Cint1, so as to obtain the first integration voltage with a magnitude $V_{int}=C_{int}\int_0^t I(t)dt$, where t is integration time. The integration time is controlled using the first reset switch Mr1 to obtain the first integration voltage. It is known from the equation that the magnitude of the first integration voltage Vint is proportional to a magnitude of the photocurrent generated by the first sensor 8. The sampling operation is performed after completion of integration.

In the DI readout circuit, the biasing voltage Vig is used for causing the second transistor M2 to conduct. The second sensor 9 senses the IR signal to generate and inject a photocurrent (second sensed current) into the second transistor M2. The charges of the photocurrent are accumulated in the second integrator capacitor Cint2, so as to obtain the second integration voltage with a magnitude $V_{int}=C_{int}\int_0^t I(t)dt$. The integration time is controlled using the second reset switch Mr2 to obtain the second integration voltage. It is known from the equation that the magnitude of the second integration voltage Vint is proportional to a magnitude of the photocurrent generated by the second sensor 9. The sampling operation is performed after completion of integration.

BDI/DI Mode (for LWIR/MWIR)

Referring to FIGS. 2 and 4, when the first signal $\phi 1$ is logic 0, and the second signal $\phi 2$ is logic 1, the first DI readout circuit 3 is not coupled to the amplifier 2, and the second DI readout circuit 4 is coupled to the amplifier 2. The second DI readout circuit 4 and the amplifier 2 thus form a BDI readout circuit, while the first DI readout circuit 3 is still a DI readout circuit. The circuit operation is the same as those described above.

DI/DI Mode (for MWIR/MWIR)

Referring to FIGS. 2 and 5, when the first signal $\phi 1$ is logic 0, and the second signal $\phi 2$ is logic 0, both of the first and second DI readout circuits 3, 4 are not coupled to the amplifier 2. Since both of the first and second DI readout circuits 3, 4 are still DI readout circuits, the reading resolution may thus become twice.

Referring to FIG. 1, in this embodiment, since the first and second DI readout circuits 3, 4 share the amplifier 2 through the switching module 5, the layout of the circuit is arranged such that the first DI readout circuit 3 and half of the amplifier 2 are disposed at a first region as a pixel, while the second DI readout circuit 4 and the other half of the amplifier 2 are disposed at a second region as another pixel adjacent to the first region. The amplifier 2 is disposed between the first and second DI readout circuits 3, 4, and the area thereof is shared by two pixels, so as to reduce the area occupied by the amplifier 2 for each pixel.

In application, the switchable readout device 20 is switched to operate in DI/BDI, BDI/DI, or DI/DI mode according to the required sensing band. Since the sensors 8, 9 may be different due to the manufacturing process, the operation mode (DI/BDI, BDI/DI, or DI/DI mode) may be selected according to the actual measurement result. Furthermore, when one of the sensors 8, 9 is damaged, the operation mode may be switched to avoid use of the damaged sensor.

This embodiment may be adjusted upon the manufacturing process to dispose the MWIR sensor on the circuit that is to operate in DI mode, and to dispose the LWIR sensor on the circuit that is to operate in BDI mode for increasing sensing bandwidth.

Therefore, this embodiment may have the following advantages:

1. Through the switching module 5, the switchable readout device 20 may be controlled using the first signal φ1 and the second signal φ2 to operate in DI/BDI, BDI/DI, or DI/DI mode, so as to be applicable to sensing of MWIR/LWIR, LWIR/MWIR, or MWIR/MWIR, respectively. The switchable readout device 20 may thus be adjustable to sense the required band instead of using different readout circuits cooperating with sensors for different bands as taught in the prior art, so as to reduce design complexity and manufacturing costs.

2. Through sharing the amplifier 2 by the first and second DI readout circuits 3, 4, the pixel area occupied by the amplifier 2 is reduced to half. Since the amplifier 2 is disposed between the first and second DI readout circuits 3, 4, layouts of elements of the amplifier 2 may thus have better symmetry, so as to obtain better stability.

Figure 6:
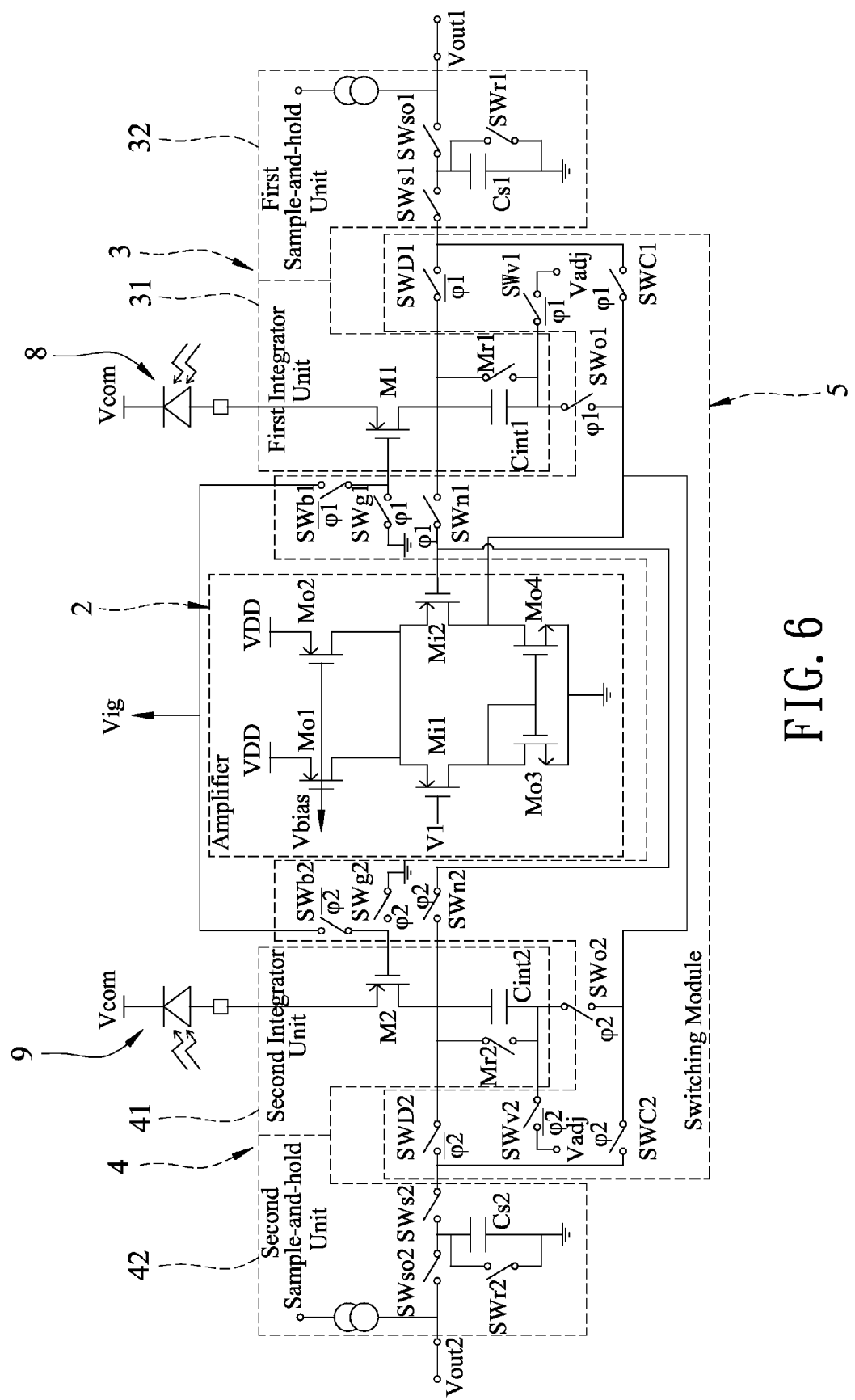
FIG. 6 is a schematic circuit diagram illustrating a second preferred embodiment of the switchable readout device according to the present invention.

Referring to FIG. 6, the second preferred embodiment of the switchable readout device according to this invention is shown to be different from the first preferred embodiment in terms of the following.

In the second preferred embodiment, the sensing target is infrared, and the first and second bands may respectively be mid-wave infrared (MWIR) and short-wave infrared (SWIR), or respectively be SWIR and MWIR.

Through operation of the switching module 5, when the first DI readout circuit 3 (or the second DI readout circuit 4) is not coupled to the amplifier 2, it is a DI readout circuit. However, when the first DI readout circuit 3 (or the second DI readout circuit 4) is coupled to the amplifier 2 through the switching module 5, the coupled first DI readout circuit 3 (or second DI readout circuit 4) and amplifier 2 form a capacitive trans-impedance amplifier (CTIA) circuit, so as to sense a different band from the DI readout circuit.

The first DI readout circuit 3 includes a current input coupled to the first sensor 8 so as to receive the first sensed current therefrom, a biasing terminal, a first terminal, a second terminal, a first integrator unit 31 and a first sample-and-hold unit 32. The first DI readout circuit 3 is controllable to convert the first sensed current for producing a first output voltage Vout1.

The first integrator unit 31 is coupled to the current input, the biasing terminal, the first terminal and the second terminal of the first DI readout circuit 3, and is configured to convert the first sensed current into a first integration voltage that has a magnitude proportional to a magnitude of the first sensed current. The first integrator unit 31 includes a first transistor M1, a first integrator capacitor Cint1 and a first reset switch Mr1.

The first transistor M1 has a first terminal coupled to the current input of the first DI readout circuit 3, a second terminal coupled to the first terminal of the first DI readout circuit 3, and a control terminal coupled to the biasing terminal of the first DI readout circuit 3. The first integrator capacitor Cint1 has a first terminal coupled to the second terminal of the first transistor M1, and a second terminal coupled to the second terminal of the first DI readout circuit 3. The first reset switch Mr1 is coupled across the first integrator capacitor Cint1 for resetting a voltage across the first integrator capacitor Cint1.

The first sample-and-hold unit 32 has a circuit configuration similar to that in the first preferred embodiment, is coupled to the first integrator unit 31 upon switching of the switching module 5 to receive the first integration voltage, and is controllable to sample the first integration voltage and hold the first integration voltage thus sampled to obtain the first output voltage Vout1. The first terminal of the first sampling switch SWs1 is coupled to the switching module 5.

The second DI readout circuit 4 includes a current input coupled to the second sensor 9 so as to receive the second sensed current therefrom, a biasing terminal, a first terminal, a second terminal, a second integrator unit 41 and a second sample-and-hold unit 42. The second DI readout circuit 4 is controllable to convert the second sensed current for producing a second output voltage Vout2.

The second integrator unit 41 is coupled to the current input, the biasing terminal, the first terminal and the second terminal of the second DI readout unit 4, and is configured to convert the second sensed current into a second integration voltage. The second integrator unit 41 includes a second transistor M2, a second integrator capacitor Cint2 and a second reset switch Mr2.

The second transistor M2 has a first terminal coupled to the current input of the second DI readout circuit 4, a second terminal coupled to the first terminal of the second DI readout circuit 4, and a control terminal coupled to the biasing terminal of the second DI readout circuit 4. The second integrator capacitor Cint2 has a first terminal coupled to the second terminal of the second transistor M2, and a second terminal coupled to the second terminal of the second DI readout circuit 4. The second reset switch Mr2 is coupled across the second integrator capacitor Cint2 for resetting a voltage across the second integrator capacitor Cint2.

The second sample-and-hold unit 42 has a circuit configuration similar to that in the first preferred embodiment, is coupled to the second integrator unit 41 upon switching of the switching module 5 to receive the second integration voltage, and is controllable to sample the second integration voltage and hold the second integration voltage thus sampled to obtain the second output voltage Vout2. The first terminal of the second sampling switch SWs2 is coupled to the switching module 5.

The switching module 5 is coupled to the inverting input (second input) of the amplifier 2 and the first terminals of the first and second DI readout circuits 3, 4. The switching module 5 is controllable to make or break electrical connection between the first terminal of the first DI readout circuit 3 and the second input of the amplifier 2, and to make or break electrical connection between the first terminal of the second DI readout circuit 4 and the second input of the amplifier 2.

The switching module 5 is further coupled to the output of the amplifier 2 and the second terminals of the first and second DI readout circuits 3, 4. The switching module 5 is controllable to make or break electrical connection between the second terminal of the first DI readout circuit 3 and the output of the amplifier 2, and to make or break electrical connection between the second terminal of the second DI readout circuit 4 and the output of the amplifier 2.

The switching module 5 is further coupled to the biasing terminals of the first and second DI readout circuits 3, 4, a ground node and a bias voltage source Vig. The switching module 5 is controllable to make or break electrical connection between the biasing terminal of the first DI readout circuit 3 and one of the ground node and the bias voltage source Vig, and to make or break electrical connection between the biasing terminal of the second DI readout circuit 4 and one of the ground node and the bias voltage source Vig.

The switching module 5 includes a first grounding switch SWg1, a first input switch SWn1, a first output switch SWo1, a first biasing switch SWb1, a first voltage switch SWv1, a first DI output switch SWD1, a first amplifier output switch SWC1, a second grounding switch SWg2, a second input switch SWn2, a second output switch SWo2, a second biasing switch SWb2, a second voltage switch SWv2, a second DI output switch SWD2 and a second amplifier output switch SWC2.

The first grounding switch SWg1 couples the control terminal of the first transistor M1 to the ground node, and is controlled by a first signal $\phi1$ to make or break electrical connection.

The first input switch SWn1 is coupled between the second input of the amplifier 2 and the first terminal of the first integrator capacitor Cint1, and is controlled by the first signal $\phi1$ to make or break electrical connection.

The first output switch SWo1 is coupled between the output of the amplifier 2 and the second terminal of the first integrator capacitor Cint1, and is controlled by the first signal $\phi1$ to make or break electrical connection.

The first biasing switch SWb1 couples the control terminal of the first transistor M1 to the bias voltage source Vig, and is controlled by the first signal $\phi1$ to make or break electrical connection.

The first voltage switch SWv1 couples the second terminal of the first integrator capacitor Cint1 to an adjustment voltage source Vadj, and is controlled by the first signal $\phi1$ to make or break electrical connection.

The first DI output switch SWD1 is coupled between the first terminal of the first integrator capacitor Cint1 and the first terminal of the first sampling switch SWs1 of the first sample-and-hold unit 32, and is controlled by the first signal $\phi1$ to make or break electrical connection.

The first amplifier output switch SWC1 is coupled between the output of the amplifier 2 and the first terminal of the first sampling switch SWs1 of the first sample-and-hold unit 32, and is controlled by the first signal $\phi1$ to make or break electrical connection.

The second grounding switch SWg2 couples the control terminal of the second transistor M2 to the ground node, and is controlled by a second signal $\phi2$ to make or break electrical connection.

The second input switch SWn2 is coupled between the second input of the amplifier 2 and the first terminal of the second integrator capacitor Cint2, and is controlled by the second signal $\phi2$ to make or break electrical connection.

The second output switch SWo2 is coupled between the output of the amplifier 2 and the second terminal of the second integrator capacitor Cint2, and is controlled by the second signal $\phi2$ to make or break electrical connection.

The second biasing switch SWb2 couples the control terminal of the second transistor M2 to the bias voltage source Vig, and is controlled by the second signal $\phi2$ to make or break electrical connection.

The second voltage switch SWv2 couples the second terminal of the second integrator capacitor Cint2 to the adjustment voltage source Vadj, and is controlled by the second signal $\phi2$ to make or break electrical connection.

The second DI output switch SWD2 is coupled between the first terminal of the second integrator capacitor Cint2 and the first terminal of the second sampling switch SWs2 of the second sample-and-hold unit 42, and is controlled by the second signal $\phi2$ to make or break electrical connection.

The second amplifier output switch SWC2 is coupled between the output of the amplifier 2 and the first terminal of the second sampling switch SWs2 of the second sample-and-hold unit 42, and is controlled by the second signal $\phi2$ to make or break electrical connection.

Figure 7:
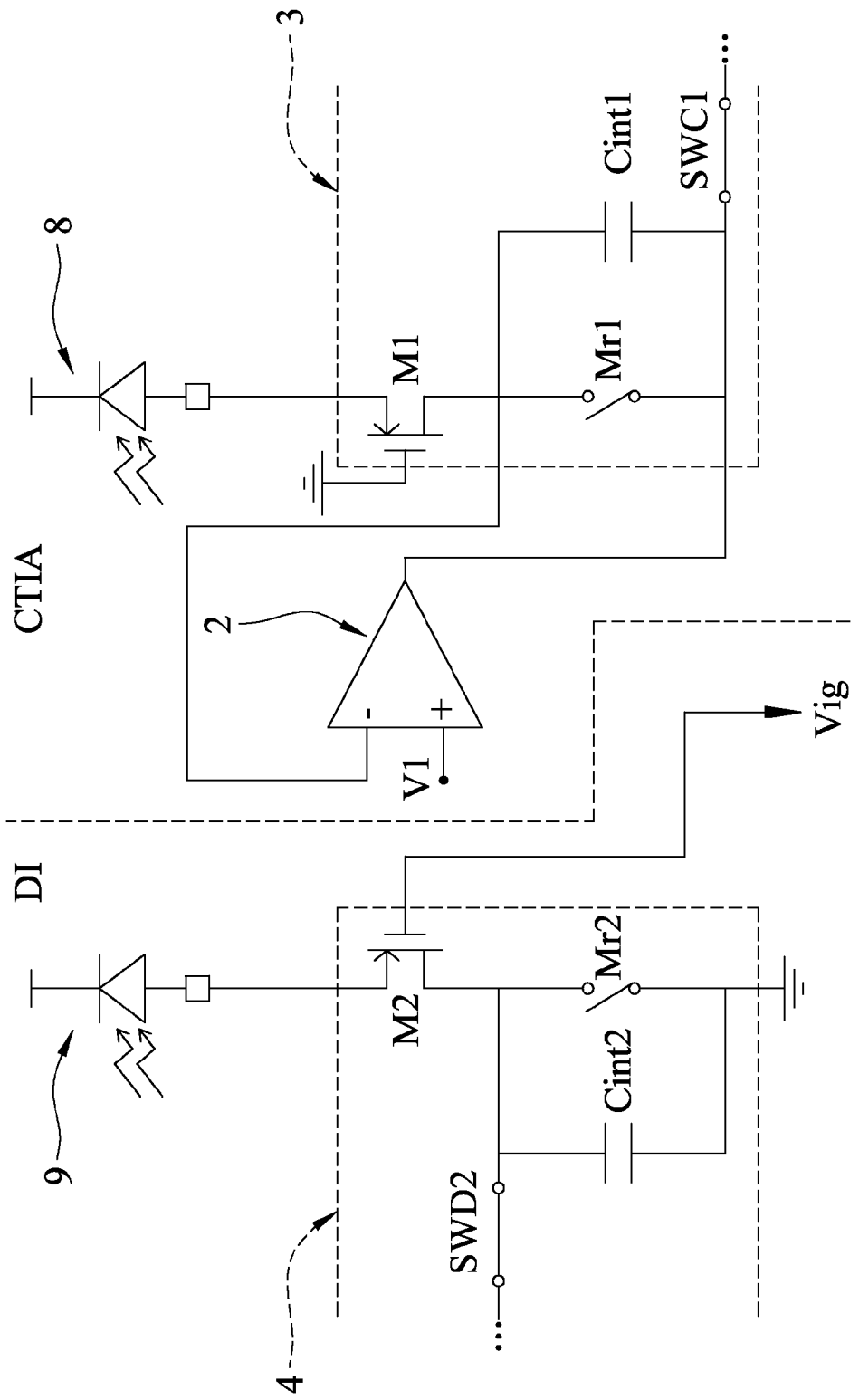
FIG. 7 is a schematic circuit diagram illustrating the second preferred embodiment operating in DI/CTIA mode.
Figure 8:
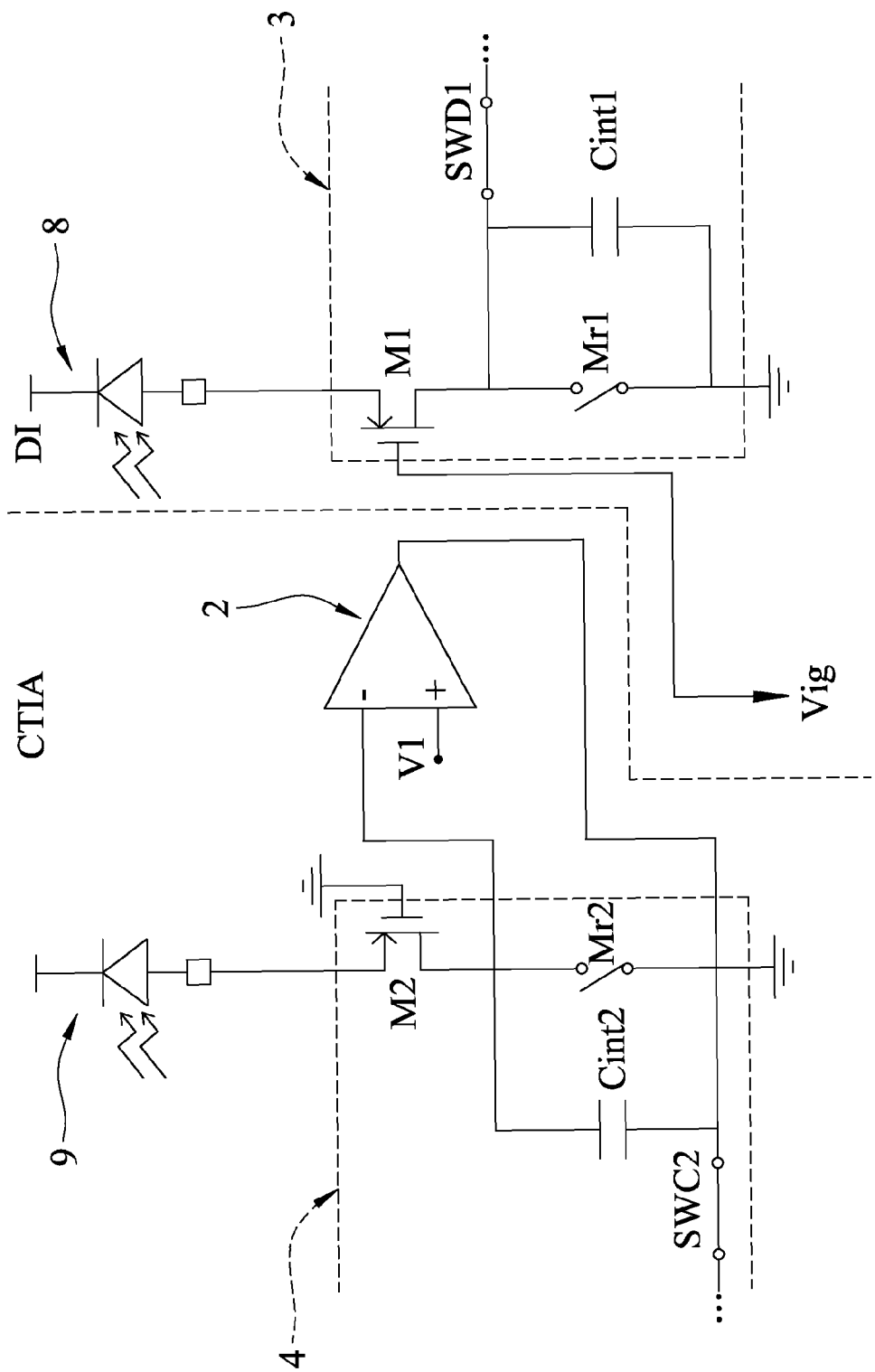
FIG. 8 is a schematic circuit diagram illustrating the second preferred embodiment operating in CTIA/DI mode.
Figure 9:
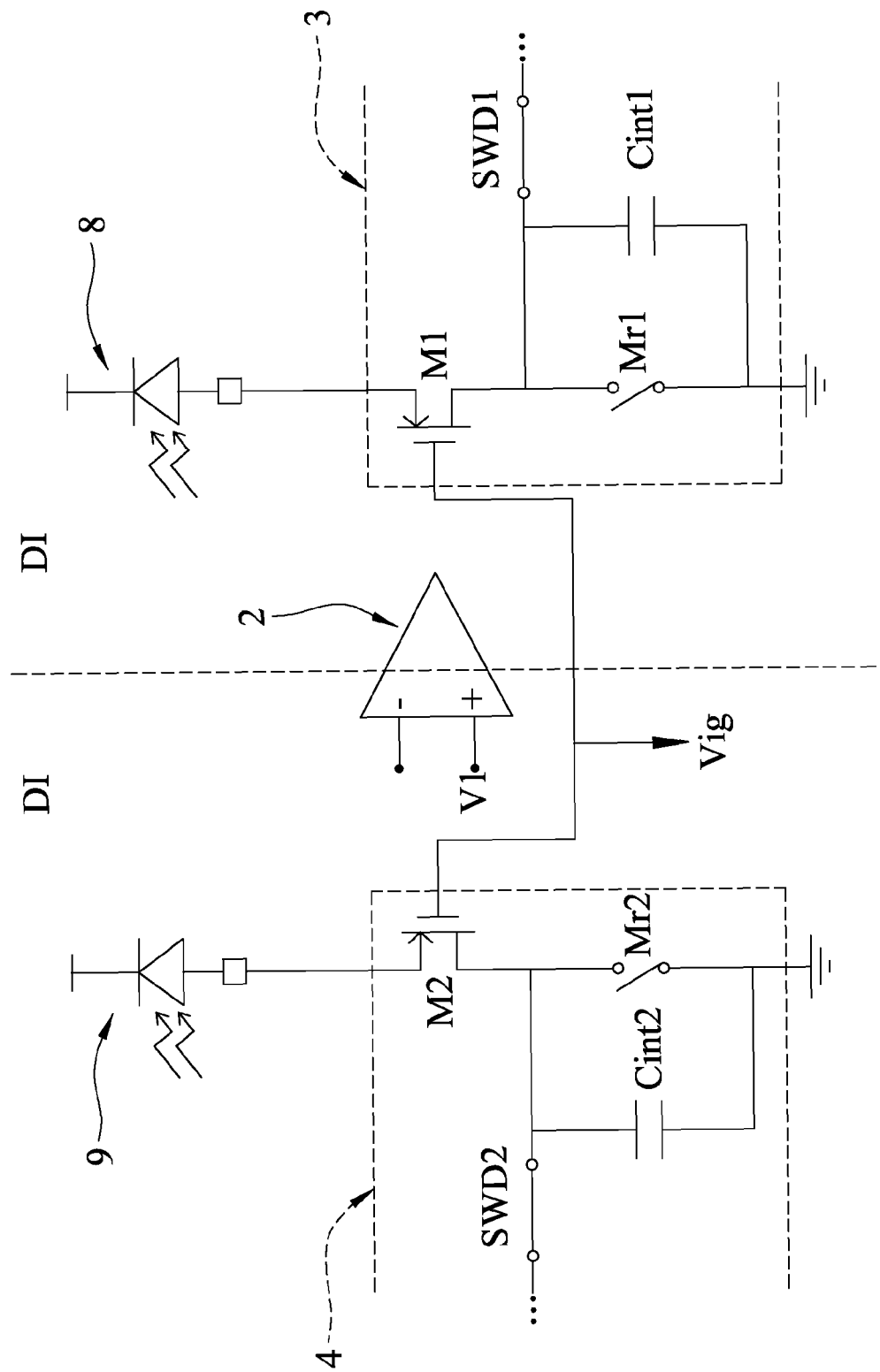
FIG. 9 is a schematic circuit diagram illustrating the second preferred embodiment operating in DI/DI mode.

As shown in FIGS. 7, 8 and 9, for the sake of illustration, only part of the circuit is drawn therein, and the adjustment voltage is denoted as a ground node. DI/CTIA mode (for MWIR/SWIR)

Referring to FIGS. 2 and 7, when the first signal $\phi1$ is logic 1, and the second signal $\phi2$ is logic 0, the first DI readout circuit 3 is coupled to the amplifier 2, and the second DI readout circuit 4 is not coupled to the amplifier 2. The first DI readout circuit 3 and the amplifier 2 thus form a CTIA circuit, while the second DI readout circuit 4 is still a DI readout circuit.

Since the first integrator capacitor Cint1 of the CTIA circuit is disposed on a negative feedback path of the amplifier 2, the area of the first integrator capacitor Cint is reduced to achieve low noise interference and high sensitivity because of Miller effect. The CTIA circuit has relatively high linearity, good biasing control and low input interference, and is thus commonly used for reading the SWIR signals. On the other hand, the DI readout circuit is used for reading the MWIR signals. As shown in FIG. 7, in the CTIA circuit, the inverting input (second input) of the amplifier 2 is coupled to the first terminal of the first integrator capacitor Cint1, the output of the amplifier 2 is coupled to the second terminal of the first integrator capacitor Cint1, the control terminal of the first transistor M1 is grounded, and the non-inverting input (first input) of the amplifier 2 receives the reference voltage V1. Through the virtual short circuit characteristic of the amplifier 2, the biasing voltage of the first sensor 8 is fixed at a magnitude that is the same as the reference voltage V1.

The first sensor 8 senses the IR signal to generate and inject a photocurrent (first sensed current) into the first transistor M1. The charges of the photocurrent are accumulated in the first integrator capacitor Cint1, so as to obtain the first integration voltage with a magnitude $V_{int} = V_{com} - C_{int}\int_0^t I(t)dt$, where t is integration time and Vcom is a common voltage of the sensors 8, 9. The integration time t is controlled using the first reset switch Mr1 to obtain the first integration voltage. The sampling operation is performed at the second terminal of the first integrator capacitor Cint1 through the first amplifier output switch SWC1 after completion of integration.

On the other hand, the second integration voltage generated by the second DI readout circuit 4 is sampled at the first terminal of the second integrator capacitor Cint2 through the second DI output switch SWD2 after completion of integration.

CTIA/DI Mode (for SWIR/MWIR)

Referring to FIGS. 2 and 8, when the first signal $\phi1$ is logic 0, and the second signal $\phi2$ is logic 1, the first DI readout circuit 3 is not coupled to the amplifier 2, and the second DI readout circuit 4 is coupled to the amplifier 2. The second DI readout circuit 4 and the amplifier 2 thus form a CTIA circuit, while the first DI readout circuit 3 is still a DI readout circuit.

The first integration voltage generated by the first DI readout circuit 3 is sampled at the first terminal of the first integrator capacitor Cint1 through the first DI output switch SWD1 after completion of integration.

The second integration voltage generated by the second DI readout circuit 4 is sampled at the second terminal of the second integrator capacitor Cint2 through the second amplifier output switch SWC2 after completion of integration.

DI/DI Mode (for MWIR/MWIR)

Referring to FIGS. 2 and 9, when the first signal φ1 is logic 0, and the second signal φ2 is logic 0, both of the first and second DI readout circuits 3, 4 are not coupled to the amplifier 2. Since both of the first and second DI readout circuits 3, 4 are still DI readout circuits, the reading resolution may thus become twice.

Therefore, the second preferred embodiment is switched to operate in DI/CTIA, CTIA/DI or DI/DI mode, so as to be applicable to sensing of MWIR/SWIR, SWIR/MWIR, or MWIR/MWIR, respectively.

To sum up, the present invention may perform dual-band sensing through the switching feature to reduce the manufacturing cost, and the sensing band is adjustable based on requirement. Furthermore, the area occupied by the amplifier 2 is reduced for each pixel.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A readout device adapted for use with a first sensor and a second sensor, the first sensor generating a first sensed current upon a sensing activity thereof, the second sensor generating a second sensed current upon a sensing activity thereof, said readout device comprising:
   an amplifier including a first input disposed to receive a reference voltage, a second input and an output;
   a first direct injection (DI) readout circuit including a current input to be coupled to the first sensor so as to receive the first sensed current therefrom, a biasing terminal, a first terminal and a second terminal, and configured to convert the first sensed current for producing a first output voltage;
   a second DI readout circuit including a current input to be coupled to the second sensor so as to receive the second sensed current therefrom, a biasing terminal, a first terminal and a second terminal, and configured to convert the second sensed current for producing a second output voltage; and
   a switching module coupled to said second input of said amplifier and said first terminals of said first and second DI readout circuits, said switching module being controllable to make or break electrical connection between said first terminal of said first DI readout circuit and said second input of said amplifier, and to make or break electrical connection between said first terminal of said second DI readout circuit and said second input of said amplifier;
   said switching module being further coupled to said output of said amplifier and said second terminals of said first and second DI readout circuits, said switching module being controllable to make or break electrical connection between said second terminal of said first DI readout circuit and said output of said amplifier, and to make or break electrical connection between said second terminal of said second DI readout circuit and said output of said amplifier;
   said switching module being further coupled to said biasing terminals of said first and second DI readout circuits, and to be coupled to a ground node and a bias voltage source, said switching module being controllable to make or break electrical connection between said biasing terminal of said first DI readout circuit and one of the ground node and the bias voltage source, and to make or break electrical connection between said biasing terminal of said second DI readout circuit and one of the ground node and the bias voltage source.

2. The readout device as claimed in claim 1, wherein said first DI readout circuit includes:
   a first integrator unit coupled to said current input, said biasing terminal, said first terminal and said second terminal of said first DI readout circuit, and configured to convert the first sensed current into a first integration voltage; and
   a first sample-and-hold unit coupled to said first integrator unit upon switching of said switching module to receive the first integration voltage, and controllable to sample the first integration voltage and hold the first integration voltage thus sampled to obtain the first output voltage;
   said second DI readout circuit including:
   a second integrator unit coupled to said current input, said biasing terminal, said first terminal and said second terminal of said second DI readout circuit, and configured to convert the second sensed current into a second integration voltage; and
   a second sample-and-hold unit coupled to said second integrator unit upon switching of said switching module to receive the second integration voltage, and being controllable to sample the second integration voltage and to hold the second integration voltage thus sampled to obtain the second output voltage.

3. The readout device as claimed in claim 2, wherein said first integrator unit includes:
   a first transistor having a first terminal coupled to said current input of said first DI readout circuit, a second terminal coupled to said first terminal of said first DI readout circuit, and a control terminal coupled to said biasing terminal of said first DI readout circuit;
   a first integrator capacitor having a first terminal coupled to said second terminal of said first transistor, and a second terminal coupled to said second terminal of said first DI readout circuit; and
   a first reset switch coupled across said first integrator capacitor for resetting a voltage across said first integrator capacitor;
   said second integrator unit including:
   a second transistor having a first terminal coupled to said current input of said second DI readout circuit, a second terminal coupled said first terminal of said second DI readout circuit, and a control terminal coupled to said biasing terminal of said second DI readout circuit;
   a second integrator capacitor having a first terminal coupled to said second terminal of said second transistor, and a second terminal coupled to said second terminal of said second DI readout circuit; and
   a second reset switch coupled across said second integrator capacitor for resetting a voltage across said second integrator capacitor.

4. readout device as claimed in claim 3, wherein said switching module includes:
- a first grounding switch disposed to couple said control terminal of said first transistor to the ground node;
- a first input switch coupled between said second input of said amplifier and said first terminal of said first integrator capacitor;
- a first output switch coupled between said output of said amplifier and said second terminal of said first integrator capacitor;
- a first biasing switch disposed to couple said control terminal of said first transistor to the bias voltage source;
- a first voltage switch disposed to couple said second terminal of said first integrator capacitor to an adjustment voltage source;
- a first DI output switch coupled between said first terminal of said first integrator capacitor and said first sample-and-hold unit;
- a first amplifier output switch coupled between said output of said amplifier and said first sample-and-hold unit;
- a second grounding switch disposed to couple said control terminal of said second transistor to the ground node;
- a second input switch coupled between said second input of said amplifier and said first terminal of said second integrator capacitor;
- a second output switch coupled between said output of said amplifier and said second terminal of said second integrator capacitor;
- a second biasing switch disposed to couple said control terminal of said second transistor to the bias voltage source;
- a second voltage switch disposed to couple said second terminal of said second integrator capacitor to the adjustment voltage source;
- a second DI output switch coupled between said first terminal of said second integrator capacitor and said second sample-and-hold unit; and
- a second amplifier output switch coupled between said output of said amplifier and said second sample-and-hold unit;
- wherein said first grounding switch, said first input switch, said first output switch, said first biasing switch, said first voltage switch, said first DI output switch and said first amplifier output switch are controlled by a first signal to make or break electrical connection, and said second grounding switch, said second input switch, said second output switch, said second biasing switch, said second voltage switch, said second DI output switch and said second amplifier switch are controlled by a second signal to make or break electrical connection.

5. The readout device as claimed in claim 4, wherein said first sample-and-hold unit includes:
- a first sampling switch having a first terminal coupled to said switching module, and a second terminal;
- a first sampling capacitor having a first terminal coupled to said second terminal of said first sampling switch, and a grounded second terminal; and
- a first sampling reset switch coupled to said first sampling capacitor in parallel for resetting a voltage across said first sampling capacitor;

said second sample-and-hold unit including:
- a second sampling switch having a first terminal coupled to said switching module, and a second terminal;
- a second sampling capacitor having a first terminal coupled to said second terminal of said second sampling switch, and a grounded second terminal; and
- a second sampling reset switch coupled to said second sampling capacitor in parallel for resetting a voltage across said second sampling capacitor;

wherein said first DI output switch is coupled between said first terminal of said first integrator capacitor and said first terminal of said first sampling switch of said first sample-and-hold unit;

said first amplifier output switch is coupled between said output of said amplifier and said first terminal of said first sampling switch of said first sample-and-hold unit;

said second DI output switch is coupled between said first terminal of said second integrator capacitor and said first terminal of said second sampling switch of said second sample-and-hold unit; and said second amplifier output switch is coupled between said output of said amplifier and said first terminal of said second sampling switch of said second sample-and-hold unit.

6. The readout device as claimed in claim 2, wherein said first sample-and-hold unit includes:
- a first sampling switch having a first terminal coupled to said switching module, and a second terminal;
- a first sampling capacitor having a first terminal coupled to said second terminal of said first sampling switch, and a grounded second terminal; and
- a first sampling reset switch coupled to said first sampling capacitor in parallel for resetting a voltage across said first sampling capacitor;

said second sample-and-hold unit including:
- a second sampling switch having a first terminal coupled to said switching module, and a second terminal;
- a second sampling capacitor having a first terminal coupled to said second terminal of said second sampling switch, and a grounded second terminal; and
- a second sampling reset switch coupled to said second sampling capacitor in parallel for resetting a voltage across said second sampling capacitor.

* * * * *